United States Patent
Chen et al.

(10) Patent No.: US 7,804,646 B2
(45) Date of Patent: Sep. 28, 2010

(54) METHOD FOR DECOMPOSITION OF A CUSTOMIZED DOE FOR USE WITH A SINGLE EXPOSURE INTO A SET OF MULTIPLE EXPOSURES USING STANDARD DOES WITH OPTIMIZED EXPOSURE SETTINGS

(75) Inventors: Ting Chen, Chandler, AZ (US); Jang Fung Chen, Cupertino, CA (US)

(73) Assignee: ASML Masktools B.V. (NL)

( * ) Notice: Subject to any disclaimer, the term of this patent is extended or adjusted under 35 U.S.C. 154(b) by 403 days.

(21) Appl. No.: 11/700,231

(22) Filed: Jan. 31, 2007

(65) Prior Publication Data

US 2007/0195394 A1    Aug. 23, 2007

Related U.S. Application Data

(60) Provisional application No. 60/763,384, filed on Jan. 31, 2006.

(51) Int. Cl.
*G02B 5/18*    (2006.01)
*G02B 27/42*    (2006.01)

(52) U.S. Cl. .......................... 359/558; 355/53; 355/67

(58) Field of Classification Search ................. 359/558; 355/52, 53, 55, 67; 369/285
See application file for complete search history.

(56) References Cited

U.S. PATENT DOCUMENTS

| | | | |
|---|---|---|---|
| 5,296,891 A | 3/1994 | Vogt et al. | |
| 5,299,872 A | 4/1994 | Ueno | |
| 5,523,193 A | 6/1996 | Nelson | |
| 5,969,441 A | 10/1999 | Loopstra et al. | |
| 6,046,792 A | 4/2000 | Van Der Werf et al. | |
| 2004/0197672 A1* | 10/2004 | Weed et al. | 430/5 |
| 2004/0265707 A1 | 12/2004 | Socha | |
| 2005/0134822 A1 | 6/2005 | Socha et al. | |
| 2006/0061756 A1* | 3/2006 | Sato et al. | 356/124 |
| 2006/0098566 A1* | 5/2006 | David et al. | 369/285 |

* cited by examiner

*Primary Examiner*—Joshua L Pritchett
(74) *Attorney, Agent, or Firm*—Pillsbury Winthrop Shaw Pittman LLP (57) ABSTRACT

A method of determining diffractive optical elements to be utilized in an imaging process. The method includes the steps of defining a customized diffractive optical element which is based on a target pattern to be printed during the imaging process; decomposing the customized diffractive optical element into one or more standard diffractive optical elements; and defining an exposure dose to be assigned to each of the one or more standard diffractive optical elements.

14 Claims, 7 Drawing Sheets

Fig. 1a

Untreated pattern used for source optimization

Fig. 1b

Customized DOE

Fig. 1c

MOPC generated using the customized DOE

Fig. 1d

Simulation results
Analysis results

FIG. 2

FIG. 5b  Std DOE #2 – X-Dipole 70deg.

FIG. 5a  Customized DOE

METHOD FOR DECOMPOSITION OF A CUSTOMIZED DOE FOR USE WITH A SINGLE EXPOSURE INTO A SET OF MULTIPLE EXPOSURES USING STANDARD DOES WITH OPTIMIZED EXPOSURE SETTINGS

CLAIM OF PRIORITY

This patent application, and any patent(s) issuing therefrom, claims priority from U.S. provisional patent application No. 60/763,384, filed on Jan. 31, 2006, entitled "Method For Decomposition Of A Customized DOE For Use With A Single Exposure Into A Set Of Multiple Exposures Using Less Complex DOEs With Optimized Exposure Settings", which is incorporated herein by reference in its entirety.

FIELD OF INVENTION

The technical field relates generally to a method and program product for decomposing a customized DOE, which was optimized in conjunction with a given target pattern and imaging process, into a plurality of standard DOEs, which are readily available and which substantially replicate the imaging performance of the customized DOE.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such a "multiple stage" apparatus the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (or mask image transfer to wafer). Another goal is to optimize illumination and enhance the contrast of an image (reproduction of circuit design) on a wafer. By increasing the overall process window (i.e., the ability to consistently print features having a specified CD regardless of whether or not the features are isolated or densely packed relative to adjacent features), one may be able to more easily accomplish each one of the goals.

Methods for optimizing the source illumination and mask patterns so as to improve the overall printing performance have been disclosed in the prior art. Exemplary methods are disclosed in U.S. Pat. Pub Nos. 2004/0265707 and 2005/0134822, both of which are incorporated herein by reference. Some imaging processes require the use of customized diffractive optical elements (DOEs), which are well known in the photolithography industry. Customized DOEs are utilized for customized pattern specific illumination source shapes that optimize the imaging performance. This is often referred to as customized illumination or customized DOEs. Customized DOEs have been shown to provide a much needed increase in imaging performance, for example, in today's most aggressive low-k1 Flash/DRAM wafer productions.

Some of the advantages associated with such customized DOEs are close to optimal performance in patterning the specific design areas from where the DOE was optimized, with source shapes containing potentially center pole and different intensities among different annular/poles. However, there are also disadvantages associated with the use of customized DOEs, which include cost (customized DOEs are expensive), purchase lead time can be long, support in optimization and verification is still important/necessary to ensure the DOE is the optimal one, and limited adjustability when used on scanners, depending on the type of the DOE as optimized for the specific patterns.

Accordingly, it is an object of the present invention to provide an illumination optimization process that allows for the benefits that are associated with the use of customized DOEs, but which avoids or eliminates the disadvantages associated therewith.

SUMMARY OF THE INVENTION

In an effort to solve the foregoing needs, it is an object of the present invention to provide a method for performing an illumination optimization process which provides for the benefits associated with the use of a customized DOE without requiring the actual manufacture of the customized DOE, thereby eliminating the significant disadvantages associated with utilizing customized DOEs.

The present invention relates to a method for decomposing a customized DOE into one or a plurality of standard DOEs (i.e., "library" DOEs—more common DOEs that come with the imaging system), which when utilized in the imaging process, provide substantially the same imaging performance as the customized DOEs. More specifically, the present invention relates to a method which includes the steps of defining a customized diffractive optical element which is based on a target pattern to be printed during the imaging process; decomposing the customized diffractive optical element into one or more standard diffractive optical elements; and defining an exposure dose to be assigned to each of the one or more standard diffractive optical elements.

In addition, the present invention relates to a computer program product embedded in a recording medium operable for controlling a computer and directing the computer to generate files corresponding to diffractive optical elements to be utilized to image a target pattern in a lithographic imaging process. The generation of the files comprises the steps of defining a customized diffractive optical element which is based on a target pattern to be printed during the imaging process; decomposing the customized diffractive optical element into one or more standard diffractive optical elements; and defining an exposure dose to be assigned to each of the one or more standard diffractive optical elements.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, the present invention provides a method for decomposing a customized DOE into one or more standard, or library DOEs, which when utilized in the illumination process, provide substantially similar imaging results as the customized DOE. By eliminating the need for actually manufacturing the customized DOE, the present invention eliminates the excessive cost and long lead time for manufacturing a customized DOE typically associated with utilizing customized DOEs.

In another advantage, the method of the present invention can provide additional levels of imaging adjustment capabilities during the imaging process. More specifically, if the decomposed DOE comprises two or more standard DOEs, then the illumination settings (e.g., NA, exposure dose, defocus settings, etc.) can be varied or optimized for each exposure, which can result in improved imaging performance.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

Figure 1A:
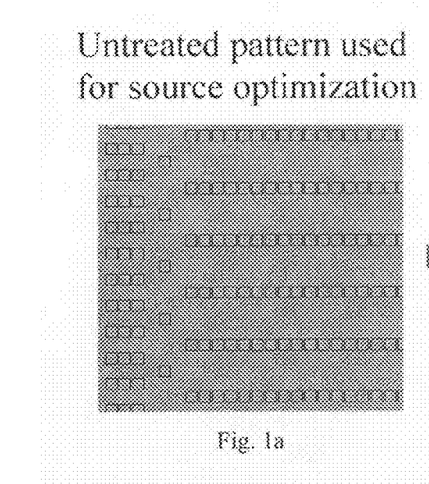
FIGS. 1a-1d illustrate a prior art example of how a customized DOE can be utilized in an imaging process.
Figure 1B:
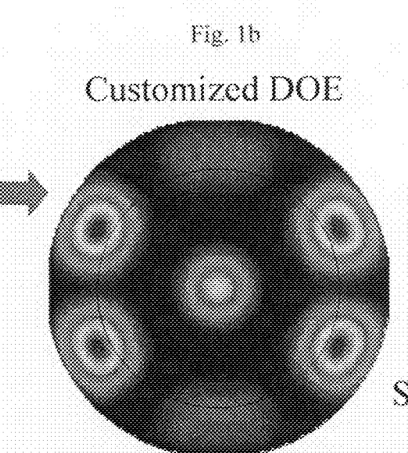
Figure 1C:
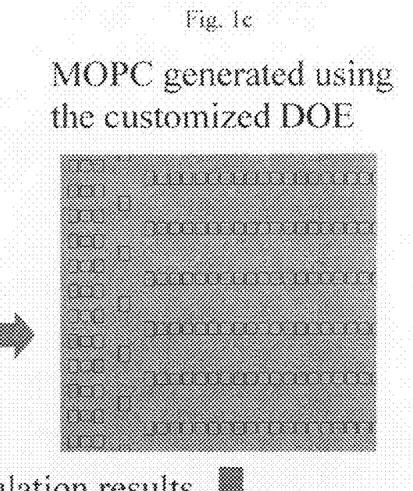
Figure 1D:
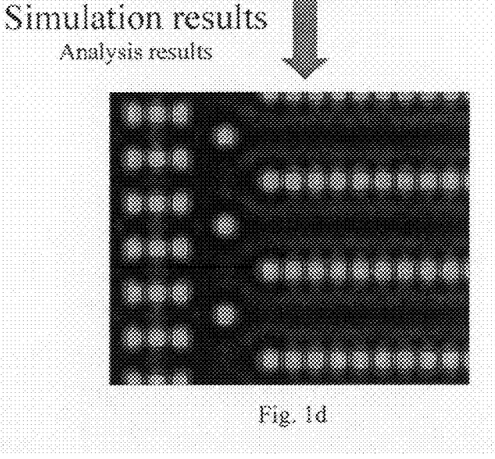

As noted above, the use of customized DOEs are well known in the art. Referring to FIGS. 1a-1d, when designing a customized DOE, first, the target pattern to be imaged on the substrate is identified, along with the imaging process to be utilized. Once the target pattern is identified (an exemplary target pattern is shown in FIG. 1a), a source illumination optimization process is executed utilizing the target pattern and the defined imaging process so as to define the optimal illumination pattern for imaging the target pattern. This optimal illumination pattern defines the customized DOE and is utilized to manufacture the customized DOE for the actual imaging process. FIG. 1b illustrates an exemplary customized DOE. As shown, the customized DOE comprises a distorted QUASAR component (i.e., X opening at 70 degrees) at an intensity of 1.0; a y-dipole component (i.e., y opening angle of 42 degrees) at an intensity of 0.125; and a center pole at an intensity of 1.0; with a Gaussian convolution which reproduces in an empirical way the 'broadening' or 'smearing' effect in the originating illumination shape defined by the DOE as it traverses through the illumination optics; the full-width-at-half-maximum (FWHM) used in this case is 0.087. Once the customized DOE is defined, in a typically imaging process, a simulation is performed utilizing the customized DOE in conjunction with the application of model optical proximity correction (MOPC) to the mask pattern (see, FIG. 1c) and the simulation results (see, FIG. 1d) are analyzed to determined if the resulting image is within acceptable process window/yield performance. If not, the OPC applied to the mask may be adjusted and the simulation re-executed until the optimal process window/yield performance is achieved.

Programs and methods for generating customized DOEs are well known, for example, the method disclosed in USP Pub. No. 2004/0265707 noted above. Any suitable known method for generating the customized DOE can be utilized when practicing the method of the present invention. It is noted that there are two basic types of customized DOEs. One is referred to as "freeform" and the other is the "manufacturable" (or constrained) DOE. Specifically, the freeform DOE is typically the initial DOE resulting from executing a customized DOE program. It represents the "ideal" or theoretical DOE produced by the given source optimization program, which does not take into account the set of "manufacturable" constraints such as minimum pole angle, space, annular width, etc. that a manufacturable DOE does. However, such "ideal" or freeform DOEs are often very difficult to manufacture, cannot be manufactured or impractical to use in the imaging system. "Manufacturable" or constrained DOEs are DOEs which can be readily manufactured and utilized in an imaging process. When generating such DOEs, constraints are typically placed in the program such that resulting DOE is "manufacturable", and at the same time delivers the optimal process window/yield performance. Typically, a manufacturable DOE can be easily made, and to a full (Zoom-Axicon compatible) or a lesser degree (non-Zoom-Axicon compatible) can be adjustable in source shape if utilized, for example, in an ASML scanner. It is also noted that customized manufacturable DOEs can have gray-level intensities (i.e., variations in percentage transmission), outer annular/poles and center/conventional pole also with different intensities. As noted above, some of the advantages associated with customized DOEs are close to optimal performance in patterning the specific target design patterns, which were utilized to generate the customized DOE.

Figure 2:
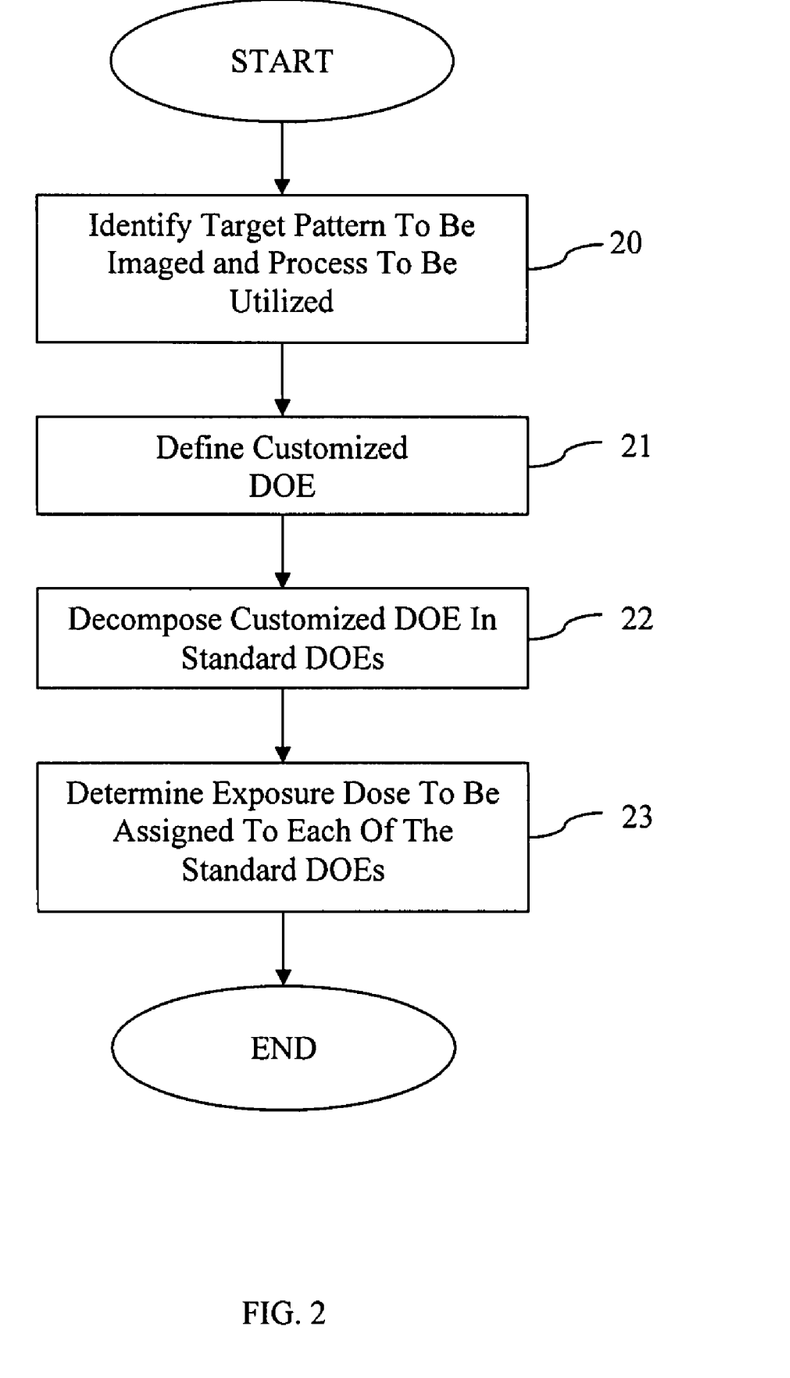
FIG. 2 is an exemplary flow chart illustrating an embodiment of the DOE decomposition process of the present invention.

FIG. 2 illustrates a flow chart of an exemplary process for decomposing a customized DOE into one or more standard DOEs in accordance with the present invention. Referring to FIG. 2, the first step (Step 20) in the process is to identify the target pattern to be imaged as well as the imaging process to be utilized. The next step in the process (Step 21) is to define the customized DOE based on the target pattern and process being utilized. The customized DOE can be defined utilizing any suitable source optimization process such as those noted above. Generally speaking, the customized DOE is defined by performing a reiterative simulation process which generates the aerial image corresponding to the target pattern and the given process for an initial source illumination, and then repeats the simulation process while varying the source illumination until the resulting aerial image is optimized. The source illumination corresponding to the optimized aerial image represents the customized DOE (i.e., the optimal source illumination for imaging the target pattern for the given process). It is noted that because the customized DOE will not be manufactured in the process of the given invention, the customized DOE utilized in the process of the present invention can be either the freeform DOE or the manufacturable DOE.

Once the customized DOE is defined, the next step in the process (Step 22) is to decompose the customized DOE into one or more standard DOEs. Standard DOEs, which constitute DOEs which are readily available, include but are not limited to DOEs which provide conventional illumination, annular illumination, X-dipole illumination, Y-dipole illumination, Quasar illumination, Cquad illumination and hexapole illumination, and their variations.

The first step in the decomposing process is to identify the components (i.e., poles or openings) forming the customized DOE defined in Step 21. Once these individual components forming the customized DOE are identified, a standard DOE, which is similar in configuration to the customized component, is selected and assigned to correspond to the given customized component. This process is performed for each component contained in the customized DOE, such that each component of the customized DOE has a corresponding standard DOE assigned thereto. It is noted that this assignment process can be performed by the operator or by an automated process as detailed below.

Once the standard DOEs are assigned to each of the components of the customized DOEs, the settings of the standard DOEs are optimized (e.g., the size of the openings, poles are varied, etc.) such that the performance of the standard DOE is made to match the performance of the corresponding component of the customized DOE as closely as possible. This can be accomplished, for example, by performing a simulation process utilizing a single component of the customized DOE and the target pattern to generate an aerial image, and then performing a reiterative simulation process utilizing the standard DOE corresponding to the single component of the customized DOE, in which the settings (e.g., openings) of the standard DOE are adjusted in an effort to minimize the difference in performance (i.e., difference in resulting aerial images) between the standard DOE and the corresponding component of the customized DOE. The performance comparison can be performed by comparing the resulting aerial images of the two simulations. It is noted that only the single component of the customized DOE currently being considered is utilized as the DOE in the simulation process so as to allow for the isolation of the performance of the given component. This process is then repeated for each of the customized DOE components so as to optimize the settings for each of the corresponding standard DOEs.

Figure 3A:
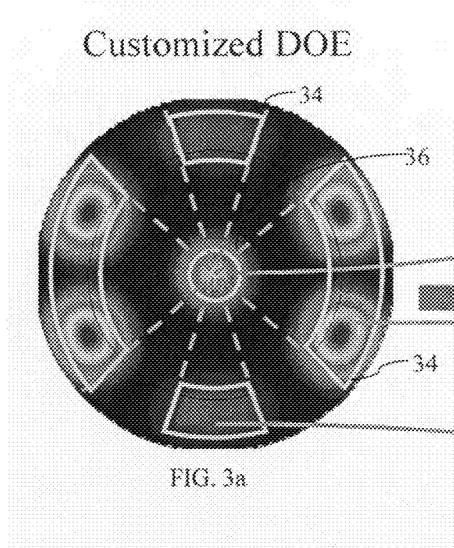
FIG. 3a-3d illustrate an exemplary embodiment of how the customized DOE illustrated in FIG. 1b can be decomposed into a plurality of standard DOEs utilizing the process of the present invention.
Figure 3B:
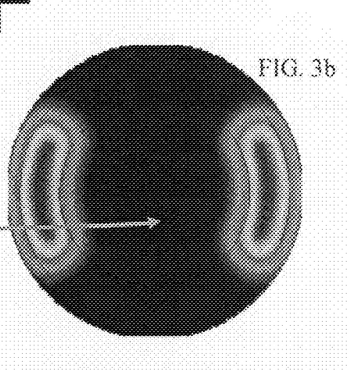
Figure 3C:
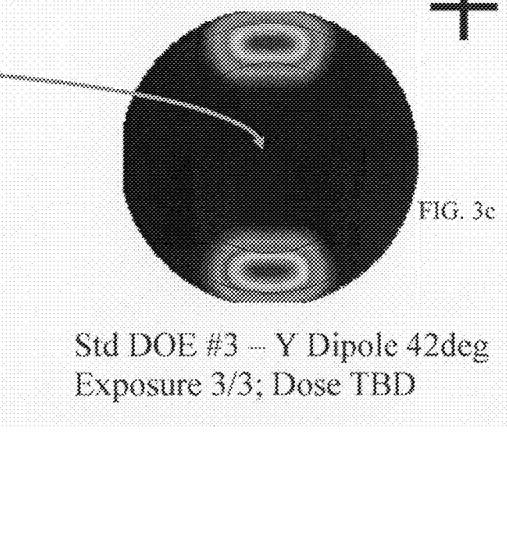
Figure 3D:
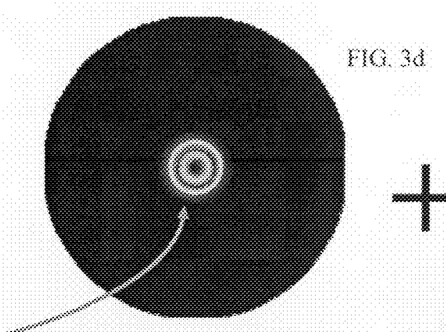

FIGS. 3a-3d illustrate an example of how a customized DOE can be decomposed into a plurality of standard DOEs utilizing the process of the present invention. FIG. 3a illustrates a customized DOE defined utilizing a suitable source illumination optimization process. As shown, the customized DOE of the given example has three basic components, which are as noted above in conjunction with FIG. 1b, a distorted QUASAR component 32; a y-dipole component 34; and a center pole component 36. Utilizing the foregoing reiterative simulation process, it is determined that the distorted QUASAR component of the customized DOE can be best replicated by use of a standard x-dipole DOE having a 70 degree opening (as shown in FIG. 3b); the y-dipole component 34 of the customized DOE can be best replicated by use of a standard y-dipole DOE having a 42 degree opening (as shown in FIG. 3c); and the center pole component of the customized DOE can be best replicated by use of a conventional illumination DOE having substantially the same size opening (as shown in FIG. 3d). It is noted that when performing the actual imaging process, a multiple exposure process is performed in which each of the customized DOE is exposed once. This multiple exposure process utilizing the standard DOEs substantially replicates the single exposure process utilizing the customized DOE.

Referring again to FIG. 2, once the customized DOE is decomposed into one or more standard DOEs, the next step (Step 23) in the process is to determine the exposure dose for each of the standard DOEs. Equation 1 below defines how the exposure dose is determined for each of the standard DOEs to be utilized in the given imaging process. Specifically, the exposure dose, $E_i$, to be assigned to a given standard DOE is defined as:

Eq. (1):

$$E_i = E_{CDOE} \cdot \frac{SA_i \cdot SI_i}{\sum_{i=1}^{n}(SA_i \cdot SI_i)}$$

where $E_{CDOE}$ equals the dose that would be utilized to expose the customized DOE (this can be determined from the simulation process utilized to generate the customized DOE); $SA_i$ equals the integrated source area of the given customized DOE component (i.e., the area of the given opening); $SI_i$ equals the intensity level assigned to the given customized DOE component (which can also be determined by the simulation process utilized to generate the customized DOE); and "n" equals the number of standard DOEs being utilized. As is clear from the foregoing equation, the process divides the exposure dose that would have been utilized to image the customized DOE between the standard DOEs produced by the decomposition process, with the dose level assigned to a given standard DOE being based on the area and illumination intensity assigned to the corresponding customized DOE component relative to the remaining components. It is noted that while the illumination intensities assigned to the components of the customized DOE can vary (i.e., the customized DOE can have grey levels or variations in transmission), typically the standard DOEs do not provide for grey levels. Standard DOEs exhibit 100% transmission in an opening and 0% transmission elsewhere. With regard to the foregoing process, when determining the value of $SI_i$ for a given component of the customized DOE, in the given embodiment, the maximum intensity value assigned to the given component is utilized as the $SI_i$ value. For example, as shown in FIG. 3a, the optimal intensity level for each of the components forming the customized DOE is different, and therefore each would have a different $SI_i$ value. Again, as noted, the intensity values assigned to the components of the customized DOE are defined by the process utilized to generate the customized DOE.

Once the exposure dose is determined and assigned to each standard DOE, the decomposition process is complete. The standard DOEs can then be utilized in an imaging process in place of the customized DOE, with a separate exposure being performed for each of the standard DOEs defined as a result of the decomposition process, with each exposure utilizing the appropriate exposure dose for the given standard DOE as defined by Equation 1 above.

Figure 4A:
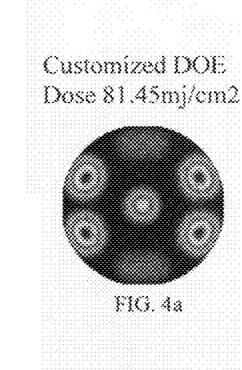
FIGS. 4a-4c illustrate the customized DOE, the decomposed standard DOEs and simulated results of the imaging process utilizing the standard DOEs.
Figure 4B:
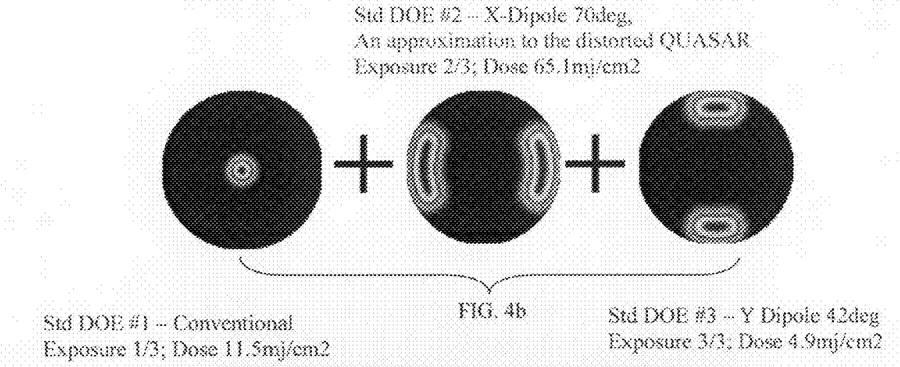
Figure 4C:
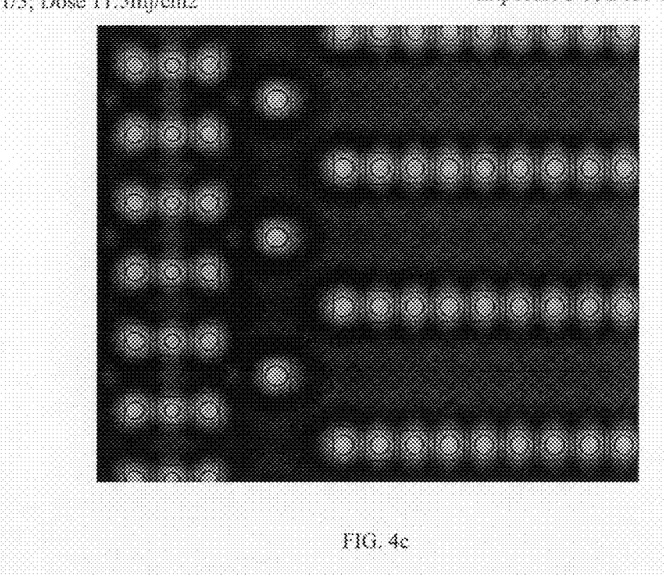

FIGS. 4a-4c illustrate simulated results of the imaging process utilizing the standard DOEs illustrated in FIGS. 3b-3d, as defined by the decomposition process of the present invention, and indicate the exposure dose to be utilized for each exposure as defined by Eq. (1) above. Referring to FIG. 4a, which again illustrates the customized DOE being utilized in the given example, the optimal exposure dose associated with this customized DOE is 81.45 mj/cm². FIG. 4b illustrates the three standard DOEs being utilized as a substitute for the customized DOE. In the given example, the conventional DOE was utilized in the first exposure with an exposure dose of 11.5 mj/cm²; the x-dipole DOE was utilized in the second exposure with an exposure dose of 65.1 mj/cm²; and the y-dipole DOE was utilized in the third exposure with an exposure dose of 4.9 mj/cm². FIG. 4c illustrates the simulated imaging results utilizing the three exposure process and the standard DOTs, and a comparison with FIG. 1d indicates that the imaging performance of the standard DOEs is substantially similar to the imaging performance obtained utilizing the customized DOE.

As noted above, the process for decomposing the customized DOE into one or more standard DOEs can also be performed utilizing an automated process, for example, implemented by a program executed by, for example, a computer or microprocessor. In general, the automated process would entail first generating a database for storing each of the available standard DOEs that can be utilized in the decomposition process. Then, once the customized DOE is generated and the poles or components of the customized DOE are identified, the following reiterative process is performed. The imaging performance of a first component of the customized DOE is compared against the imaging performance of each of the available standard DOEs. This is done utilizing any suitable known simulation process, which provides for example, the generation of a simulated aerial image. It is noted that the simulation is run utilizing the target pattern utilized to generate the customized DOE. Then, the standard DOE that exhibits an imaging performance that best matches the given component of the customized DOE is selected as the standard DOE corresponding to the given component of the customized DOE. This process is then repeated for each component of the customized DOE. Once all of the components of the customized DOE has a standard DOE assigned thereto, optimization of the settings (e.g., opening size) of the standard DOEs can be performed so as to further optimize the imaging performance of the selected standard DOEs in an effort to match the imaging performance of the corresponding component of the customized DOE. As noted above, this optimization can also be performed by executing reiterative simulations and comparing the imaging results of the standard DOE relative to the corresponding component of the customized DOE. The result of this process is the identification of optimized standard DOEs. As also noted above, these DOEs can then be utilized in the imaging process.

Figure 5A:
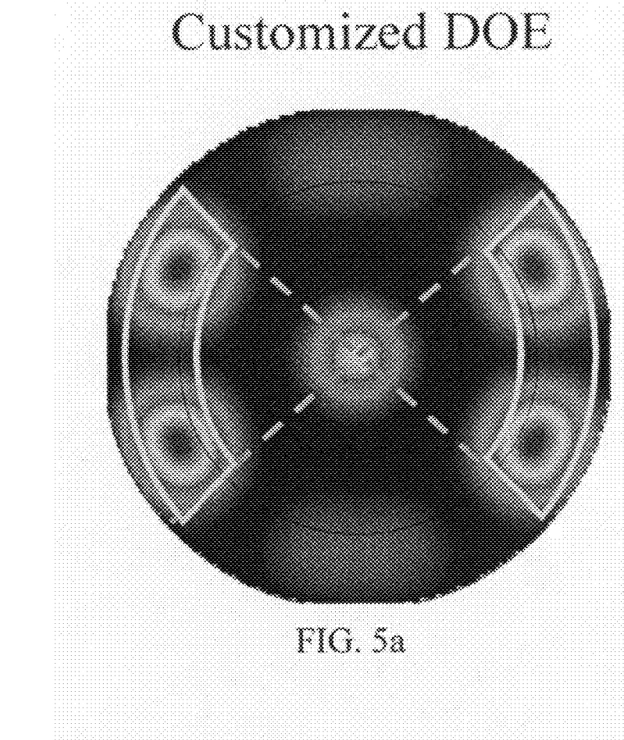
FIGS. 5a and 5b illustrate an exemplary embodiment of how a customized DOE can be decomposed into a single standard DOE.
Figure 5B:
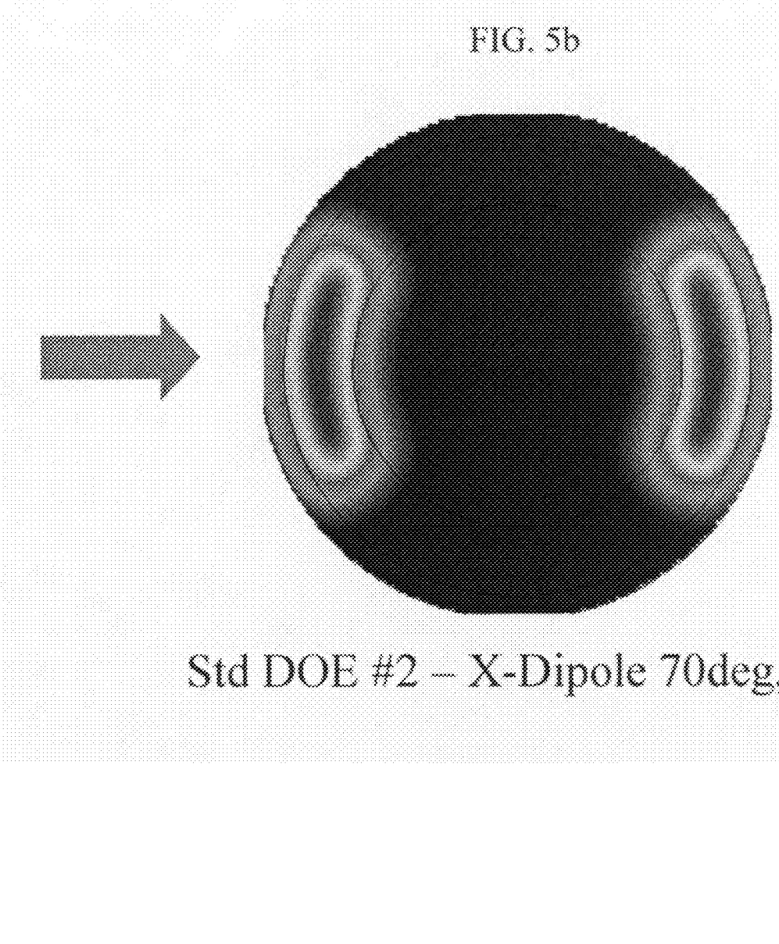

In a variation of the foregoing process, the present invention also allows for the use of a reduced number of standard DOEs when attempting to match the customized DOE by compensating for the increased differences between the standard DOEs and the components of the customized DOE by varying illumination settings, such as, for example, exposure dose, NA, defocus settings, etc. FIG. 5a illustrates an example of a customized DOE, and FIG. 5b illustrates the standard DOE utilized to implement the customized DOE. By adjusting the angles of the dipole DOE of FIG. 5b in combination with the exposure dose, it is possible to generate similar imaging performance as compared to the customized DOE using a single standard DOE. FIGS. 5a and 5b also indicate that there need not be a one-to-one correspondence between the components of the customized DOE and the number of standard DOEs utilized to implement the customized DOE.

It is also noted that the method of the present invention can be utilized in conjunction with both clear field masks and dark field masks. The method can also be utilized in conjunction with double exposure or double patterning lithography methods in which more than one mask is utilized to form a single layer pattern. The method is also not limited to IC manufacturing, but can be utilized in conjunction with TFTs, large size substrate lithography, forming read/write head for hard disk drive, EUJs, and optical direct write lithography (OML).

As noted above, the method of the present invention provides important advantages over the prior art. Most importantly, the present invention provides a method for decomposing a customized DOE into one or more standard, readily available DOEs, which when utilized in the illumination process, provide substantially similar imaging results. By eliminating the need for actually manufacturing the customized DOE, the present invention eliminates the excessive cost and long lead time for manufacturing a customized DOE typically associated with utilizing customized DOEs.

In another advantage, the method of the present invention can provide additional levels of imaging adjustment capabilities during the imaging process. More specifically, if the decomposed DOE comprises two or more standard DOEs, then the illumination settings (e.g., NA, defocus settings, exposure dose, etc.) can be varied or optimized for each exposure, which can result in improved imaging results.

Figure 6:
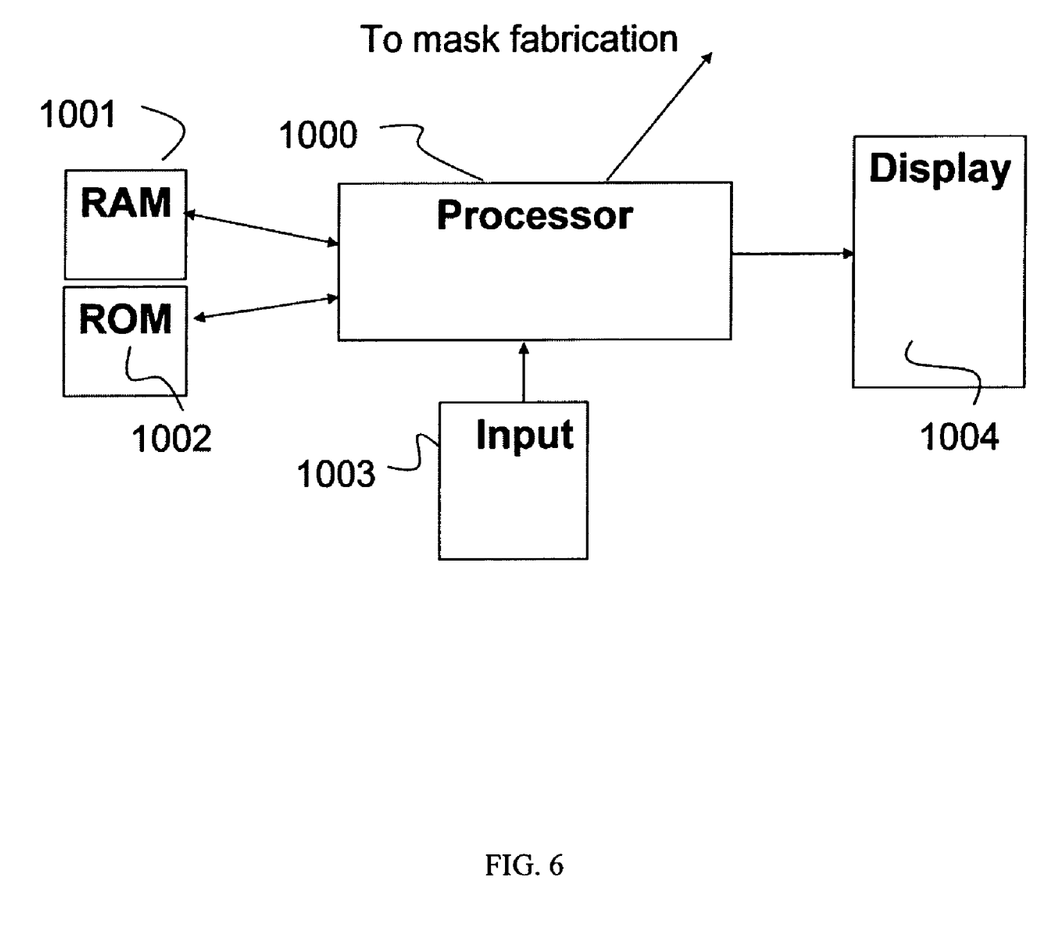
FIG. 6 illustrates an exemplary processing system for implementing the decomposition method of the present invention.

FIG. 6 illustrates an exemplary processing system for performing the design process of the present invention. As illustrated in FIG. 6, an exemplary processing system may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the methods detailed above for decomposing customized DOEs in accordance with the present invention, and stores information on RAM 1001. The calculated results (e.g., DOE design) of processor 1000 may be displayed on display 1004 and may be provided to a DOE fabrication unit or manufacturer.

The software functionalities of such a computer system involve programming, including executable code, may be used to implement the above described OPC method for placing scattering bars within a given target pattern. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 7:
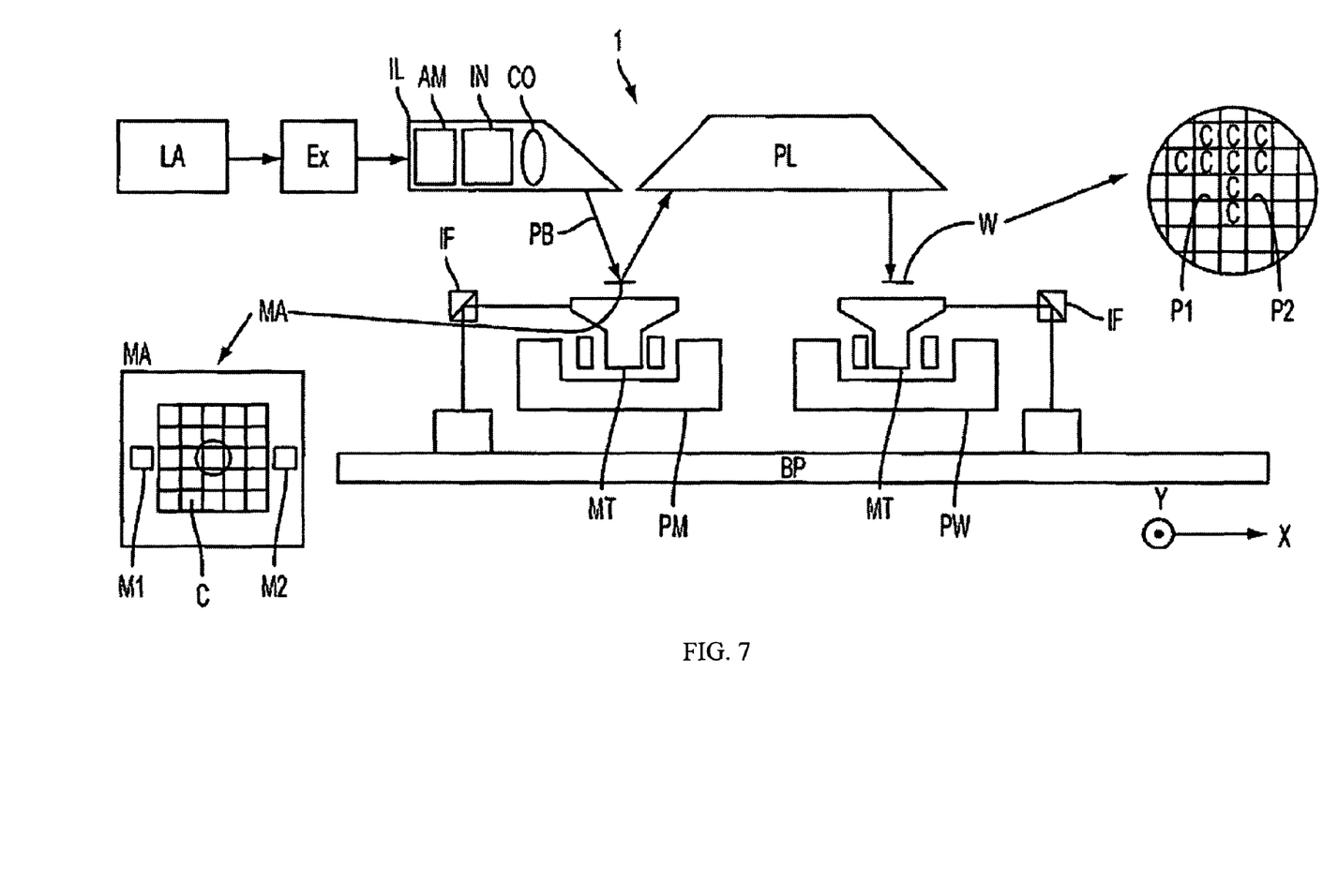
FIG. 7 schematically depicts a lithographic projection apparatus suitable for use with the masks designed with the aid of the current invention.

FIG. 7 schematically depicts a lithographic projection apparatus suitable for use with the DOEs designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 7 that the source LA and DOE may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of determining diffractive optical elements to be utilized in an imaging process, said method comprising the steps of:

defining a customized diffractive optical element which is based on a target pattern to be printed during said imaging process;

decomposing said customized diffractive optical element into one or more standard diffractive optical elements; and defining an exposure dose to be assigned to each of said one or more standard diffractive optical elements, wherein the one or more standard diffractive optical elements are adapted to adjust characteristics of radiation that projects from an illumination source in the imaging process, and wherein the radiation, after it has been projected from the illumination source, illuminates a mask having features corresponding to the target pattern during the imaging process, so as to print the target pattern on a wafer.

2. The method of claim 1, wherein said step of decomposing said customized diffractive optical element into one or more standard diffractive optical elements, includes:

identifying components forming said customized diffractive optical element;

assigning a standard diffractive optical element to each of said components of said customized diffractive optical element; and adjusting variable settings associated with each said standard diffractive optical element so as so minimize the differences beteen the imaging performance of each standard diffractive optical element and the corresponding component of the customized diffractive optical element.

3. The method of claim 2, wherein said variable settings include the size of the illumination openings on each said standard diffractive optical element.

4. The method of claim 2, wherein said variable settings include an exposure dose setting; a numerical aperture setting; and a defocus setting.

5. The method of claim 2, further assigning an exposure dose to each of said standard diffractive optical elements, said exposure dose being a weighted value based on an exposure dose setting assigned to said customized diffractive optical element.

6. The method of claim 1, wherein said standard diffractive optical elements include conventional illumination, annular illumination, X-dipole illumination, Y-dipole illumination, Quasar illumination, Cquad illumination and hexapole illumination.

7. A method according to claim 1, wherein the characteristics include one or more of illumination shape and illumination intensity.

8. A method of imaging a mask having a target pattern, said method comprising the steps of:
  defining a set of process parameters to be utilized to image said mask;
  defining a customized diffractive optical element which is based on said target pattern and said set of process parameters;
  decomposing said customized diffractive optical element into one or more standard diffractive optical elements;
  defining an exposure dose to be assigned to each of said one or more standard diffractive optical elements, and
  utilizing said one or more standard diffractive optical elements to adjust characteristics of radiation projected from an illumination source when imaging said mask, wherein the radiation illuminates the mask after it has been projected from the illumination source.

9. The method of claim 8, wherein said step of decomposing said customized diffractive optical element into one or more standard diffractive optical elements, includes:
  identifying components forming said customized diffractive optical element;
  assigning a standard diffractive optical element to each of said components of said customized diffractive optical element; and
  adjusting variable settings associated with each said standard diffractive optical element so as so minimize the differences between the imaging performance of each standard diffractive optical element and the corresponding component of the customized diffractive optical element.

10. The method of claim 9, wherein said variable settings include the size of the illumination openings on each said standard diffractive optical element.

11. The method of claim 9, wherein said variable settings include an exposure dose setting; a numerical aperture setting; and a defocus setting.

12. The method of claim 9, further assigning an exposure dose to each of said standard diffractive optical elements, said exposure dose being a weighted value based on an exposure dose setting assigned to said customized diffractive optical element.

13. The method of claim 8, wherein said standard diffractive optical elements include conventional illumination, annular illumination, X-dipole illumination, Y-dipole illumination, Quasar illumination, Cquad illumination and hexapole illumination.

14. A method according to claim 8, wherein the characteristics include one or more of illumination shape and illumination intensity.

* * * * *